United States Patent
Gunji

(10) Patent No.: US 7,586,285 B2
(45) Date of Patent: Sep. 8, 2009

(54) GROUND FAULT DETECTION DEVICE FOR MOTOR DRIVING CIRCUIT

(75) Inventor: Keita Gunji, Ichinomiya (JP)

(73) Assignee: OMRON Corporation, Kyoto (JP)

( * ) Notice: Subject to any disclaimer, the term of this patent is extended or adjusted under 35 U.S.C. 154(b) by 226 days.

(21) Appl. No.: 11/711,598

(22) Filed: Feb. 27, 2007

(65) Prior Publication Data

US 2007/0211396 A1   Sep. 13, 2007

(30) Foreign Application Priority Data

Mar. 9, 2006   (JP)   ............................. 2006-064675

(51) Int. Cl.
*H02P 3/18* (2006.01)
(52) U.S. Cl. ..................... 318/717; 318/716; 318/806; 361/31; 361/42
(58) Field of Classification Search ............... 318/370, 318/375, 376, 717, 716, 806; 361/31, 42
See application file for complete search history.

(56) References Cited

U.S. PATENT DOCUMENTS

| | | | | |
|---|---|---|---|---|
| 4,832,133 | A * | 5/1989 | Boys | 173/1 |
| 5,214,575 | A * | 5/1993 | Sugishima et al. | 363/37 |
| 5,483,167 | A * | 1/1996 | Mikami | 324/510 |
| 5,650,708 | A * | 7/1997 | Sawada et al. | 318/801 |
| 5,768,079 | A * | 6/1998 | Buell | 361/78 |
| 6,335,600 | B1 * | 1/2002 | Kasai et al. | 318/434 |
| 7,170,245 | B2 * | 1/2007 | Youm | 318/375 |
| 7,176,651 | B2 * | 2/2007 | Kifuku et al. | 318/801 |
| 7,233,465 | B2 * | 6/2007 | Lee | 361/42 |
| 2005/0099743 | A1 | 5/2005 | Lee | |

FOREIGN PATENT DOCUMENTS

| | | |
|---|---|---|
| JP | 06-115444 A | 4/1994 |
| JP | 06-127396 A | 5/1994 |
| JP | 6-233450 | 8/1994 |
| JP | 11-046483 A | 8/1994 |

(Continued)

OTHER PUBLICATIONS

European Search Report dated May 31, 2007 issued in European Application No. 07000250.6-2207, 6 pages.

(Continued)

*Primary Examiner*—Bentsu Ro
*Assistant Examiner*—David S Luo
(74) *Attorney, Agent, or Firm*—Osha • Liang LLP

(57) ABSTRACT

A motor driving circuit includes an inverter circuit including switching devices connected in a bridge manner, electric-current detection resistances connected between the lower switching devices in the inverter circuit and the ground, so as to enable detection of the phase currents with the electric-current detection resistances, a PWM circuit which controls ON/OFF of the switching devices and repeatedly causes powering and regenerative time intervals, by alternately turning on and off the upper switching devices and the lower switching devices. During a time interval during which the lower switching devices, the electric-current detection resistances and the motor constitute a closed circuit and a regenerated electric current flows through the circuit, when the electric current values detected are equal to or greater than a predetermined electric current value, it is determined that a ground fault has occurred in the connection lines between the inverter circuit and the motor.

2 Claims, 9 Drawing Sheets

FOREIGN PATENT DOCUMENTS

JP 3240535 10/2001
JP 3245727 11/2001

OTHER PUBLICATIONS

Patent Abstracts of Japan, Publication No. 06-233450 dated Aug. 19, 1994, 1 page.

Patent Abstracts of Japan, Publication No. 11-046483 dated Feb. 16, 1999, 1 page.

Patent Abstracts of Japan, Publication No. 06-115444 dated Apr. 26, 1994, 1 page.

Patent Abstracts of Japan, Publication No. 06-127396 dated May 10, 1994, 1 page.

* cited by examiner

GROUND FAULT DETECTION DEVICE FOR MOTOR DRIVING CIRCUIT

BACKGROUND OF THE INVENTION

1. Field of the Invention

The present invention relates to a device for detecting ground faults in an inverter device for driving a brushless motor used in an electric power steering device for a vehicle and, more particularly, to a motor-driving-circuit ground-fault detection device for detecting ground faults in connection lines between a motor and an inverter circuit.

2. Description of the Related Art

An electric power steering device for a vehicle is provided with a motor such as a three-phase brushless motor, in order to apply, to a steering mechanism, a steering aiding force corresponding to the steering torque of a handle. The steering torque applied to the handle is detected by a torque sensor and, on the basis of the detected value, target values of electric currents to be flowed through the motor are calculated. Then, on the basis of the deflections between the target values and the values of the electric currents actually flowing through the motor, command values for feedback control to be supplied to a motor driving portion are calculated. The motor driving circuit includes an inverter circuit provided with upper and lower pairs of switching devices in association with the respective phases, and a PWM circuit for creating PWM (Pulse Width Modulation) signals having duty ratios corresponding to the command values and then switching control of the ON/OFF time intervals of the switching devices. The inverter circuit outputs voltages for the respective phases which correspond to the duty ratios, on the basis of the ON/OFF operations of the switching devices, to drive the motor with the voltages. The electric currents in the respective phases of the motor are detected by determining the voltages between the opposite ends of electric-current detection resistances connected in serial to the respective switching devices, and these detected values are the values of the electric currents actually flowing through the motor. Detections of phase currents in such a PWM type motor driving device are described in, for example, Japanese Patent Publication No. 3245727 and Japanese Patent Publication No. 3240535. Further, by using the electric-current detection resistances, it is possible to detect an excessive electric current flowing through the motor driving portion due to some abnormalities, in the event that the electric current values exceed a predetermined excessive-electric-current detection range.

Japanese Patent Publication No. 3245727 describes a motor driving device including a three-phase brushless motor, an inverter circuit for driving the motor, a PWM circuit which performs PWM control on the inverter circuit and electric-current detection resistances for detecting the phase currents flowing through the motor, wherein there is provided a sample-and-hold circuit which samples and holds the voltages across the electric-current detection resistances for the respective phases, using PWM signals from the PWM circuit as sampling signals, and outputs the sampled-and-held signals as phase-current detection signals.

Japanese Patent Publication No. 3240535 describes provision of a circuit which generates timing signals in addition to the structure of Japanese Patent Publication No. 3245727, for starting sampling of the voltages across the electric-current detection resistances later than the timing when the switching devices in the inverter circuit are turned on and ending the sampling of the voltages across the electric-current detection resistances earlier than the timing when the switching devices in the inverter circuit are turned off, on the basis of the timing signals from the circuit.

Japanese Patent Application Laid-Open No. 6-233450 describes a structure including lower switching devices connected to one another at their ground connection terminals, a first electric-current detection resistance for detecting an excessive electric current which is connected between the connection point among the lower switching devices and the ground, upper switching devices connected to one another at their power-supply connection terminals and a second electric-current detection resistance connected between the connection point among the upper switching devices and a power supply.

Further, the second electric-current detection resistance is provided in order to detect an excessive ground-fault electric current flowing through the resistance and to detect, therefrom, the occurrence of a ground fault, in the event of a ground fault in connection lines between an inverter circuit and a motor.

SUMMARY OF THE INVENTION

With the device described in Japanese Patent Application Laid-Open No. 6-233450 described above, it is possible to detect the occurrences of excessive electric currents and ground faults in the inverter circuit, but there is a need for connecting the second electric-current detection resistance between the power-supply connection terminals of the upper switching devices and the power supply, thus inducing inconvenience as follows.

Namely, operational amplifiers (differential amplification circuits) are used for detecting electric currents and, in order to detect an electric current with the second electric-current detection resistance, a power-supply voltage should be input to an operational amplifier, which necessitates selection of an operational amplifier with excellent performance in common mode rejection ratio CMR indicating the ratio between the variation of the input voltage and the variation of an input offset voltage (DC variation, in general), thereby involving higher cost. Furthermore, the second electric-current detection resistance should be used in addition to the first electric-current detection resistance, which further increases the numbers of electric-current detection operational amplifiers and devices in their peripheral circuit structures, thereby complicating the circuit structure and also increasing the amount of heat generated from resistances. This has induced inconvenience of degradation of the efficiency of the inverter circuit.

It is an object of the present invention to provide a motor-driving-circuit ground-fault detection device capable of detecting ground faults, which are the occurrence of grounding, in connection lines between an inverter circuit and a motor, without using a second electric-current detection resistance as described above.

A ground-fault detection device for a motor driving circuit according to the present invention includes an inverter circuit including upper switching devices and lower switching devices which are connected in a bridge and are connected at their output sides to the respective phases of a motor, and electric-current detection resistances connected between the respective lower switching devices in the inverter circuit and the ground. The electric-current detection resistances are connected between the respective lower switching devices and the ground for controlling the phase currents. The inverter circuit is controlled by a switching control circuit constituted by a PWM circuit.

Namely, the switching control circuit repeatedly causes a first powering time interval during which an electric current flows from a power supply through an upper switching device in the inverter circuit, the motor and a lower switching device for powering the motor, a first regenerative time interval during which lower switching devices, electric-current detection resistances and the motor constitute a closed circuit and a regenerated electric current flows through the circuit, a second powering time interval during which an electric current flows from the power supply through an upper switching device in the inverter circuit, the motor and a lower switching device for powering the motor, and a second regenerative time interval during which upper switching devices and the motor constitute a closed circuit and a regenerated electric current flows through the circuit and, also, performs control for switching among the respective time intervals.

If it is desired to increase the phase electric currents, it is necessary to increase the powering time interval in a single cycle, thereby reducing the regenerative time interval. If it is desired to reduce the phase electric currents, on the contrary, it is necessary to reduce the powering time interval in a single cycle, thereby increasing the regenerative time interval.

The electric-current detection resistances are connected at their opposite ends to electric-current detection circuits, which enables to detect the value of the electric currents flowing through the electric-current detection resistances on the basis of the voltages generated between the opposite ends of these resistances, during the switching control. The electric-current detection circuits can be constituted by operational amplifiers (differential amplification circuits).

According to the present invention, if the electric current values detected by the electric-current detection circuits during the first regenerative time interval are equal to or greater than a predetermined electric current value, it is determined that a ground fault has occurred in connection lines between the inverter circuit and the motor.

With the switching control circuit, as described above, during the first powering time interval, a powering electric current is flowed from the power supply to the motor and, during the first regenerative time interval immediately thereafter, a closed circuit is constituted by lower switching devices, electric-current detection resistances and the motor, and a regenerated electric current (induced electric current) is flowed through the closed circuit. In this case, in the event of the occurrence of a ground fault in a connection line between the inverter circuit and the motor, a ground-fault electric current flows from the power supply through an upper switching device, during the first powering time interval. In such a case, the ground-fault electric current is a large electric current, which causes significant electric current energy to be accumulated in the inductance distribution (parasitic inductance) between the inverter circuit and the position of the ground fault. During the first regenerative time interval at the subsequent moment, the accumulated electric current energy flows through the lower switching devices and the electric-current detection resistances connected to these devices, which constitute the closed circuit, and through the ground. According to the present invention, by utilizing this behavior, it is determined that a ground fault has occurred, in the event that the electric current values detected during the first regenerative time interval are equal to or greater than a predetermined electric current value.

As described above, according to the present invention, the electric current energy which has been accumulated, during the first time interval, in the inductance distribution (parasitic inductance) between the inverter circuit and the position of a ground fault is detected with the electric-current detection resistances during the first regenerative time interval, which eliminates the necessity of providing a second electric-current detection resistance for detecting ground faults, as in Japanese Patent Application Laid-Open No. 6-233450. This enables detection of ground faults, without complicating the circuit structure and without degrading the efficiency.

According to the present invention, it is possible to detect ground faults with a simple circuit structure, without reducing the efficiency of the inverter circuit.

DETAILED DESCRIPTION OF THE PREFERRED EMBODIMENTS

Figure 1:
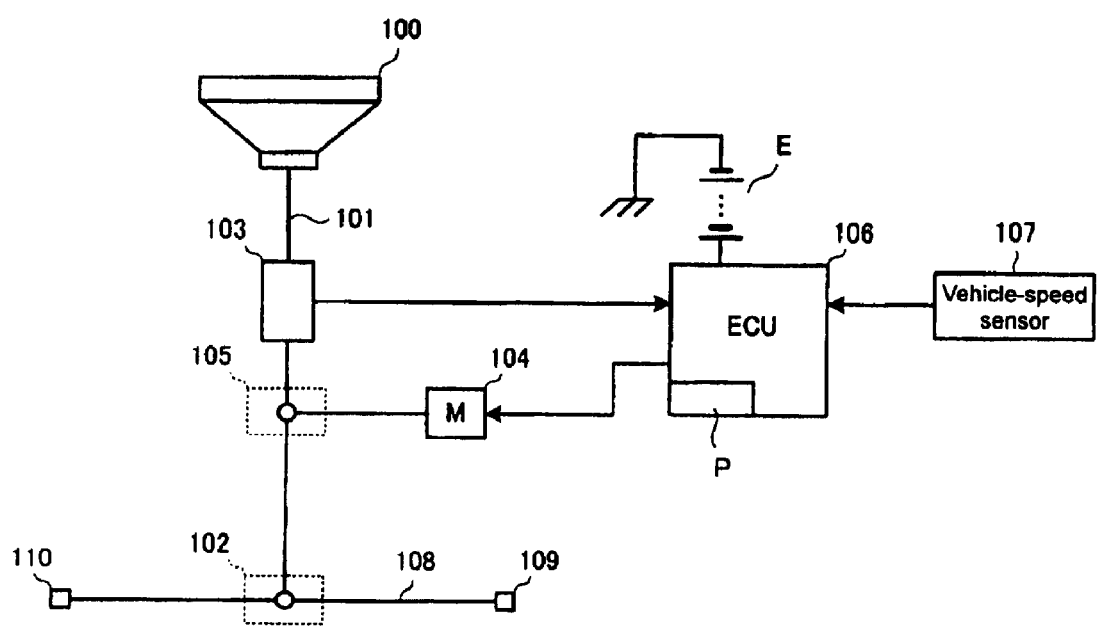
FIG. 1 shows a view illustrating the general structure of an electric power steering device which used in the present invention.

FIG. 1 is a view illustrating the general structure of an electric power steering device which used in the present invention.

The electric power steering device includes a handle 100 for steering, a steering shaft 101 secured at its one end to the handle 100, a rack and pinion mechanism 102 coupled to the other end of the steering shaft 101, a torque sensor 103 provided in a portion of the steering shaft 101 for detecting the steering torque which is applied to the steering shaft 101 through operations on the handle 100, and a worm wheel mechanism 105 for applying, to the steering shaft 101, the rotational driving force from a three-phase brushless motor (hereinafter, refereed to as a motor) 104 as a steering assist force (steering aiding force).

The torque sensor 103, the motor 104 and a vehicle-speed sensor 107 are connected to a vehicular electronic control unit (ECU) 106, wherein the ECU 106 controls the driving electric current of the motor 104 on the basis of detection signals from the torque sensor 103 and the vehicle-speed sensor 107. The ECU 106 includes a motor driving portion P and has the function of forming motor driving voltages which form voltages for driving the motor 104.

Further, a tie rod 108 is connected to a steering gear box 102 and, at its opposite ends, there are provided tie rod ends 109 and 110 which enable coupling to the vehicle (not illustrated).

With the structure, on the basis of steering-torque detection signals provided from the torque sensor 103 when steering is performed through the handle 100 and vehicle-speed detection signals provided from the vehicle-speed sensor 107, the ECU 106 applies motor driving voltages corresponding to these detection signals to the motor 104, by refereeing to a pre-set table. More specifically, the ECU 106 calculates target values of the phase electric currents to be flowed through the motor 104 by referring to the aforementioned table and creates PWM signals (motor driving voltages) for driving the inverter circuit, on the basis of the difference between the target values and the electric currents actually flowing through the motor 104.

Accordingly, the motor 104 applies a steering assist force to the steering shaft 101.

While, in the present embodiment, the motor driving voltages are applied to the motor 104 on the basis of the steering torque and the vehicle speed, it is also possible to form motor driving voltages simply on the basis of only the steering torque, since the steering torque relates to the vehicle speed.

Figure 2:
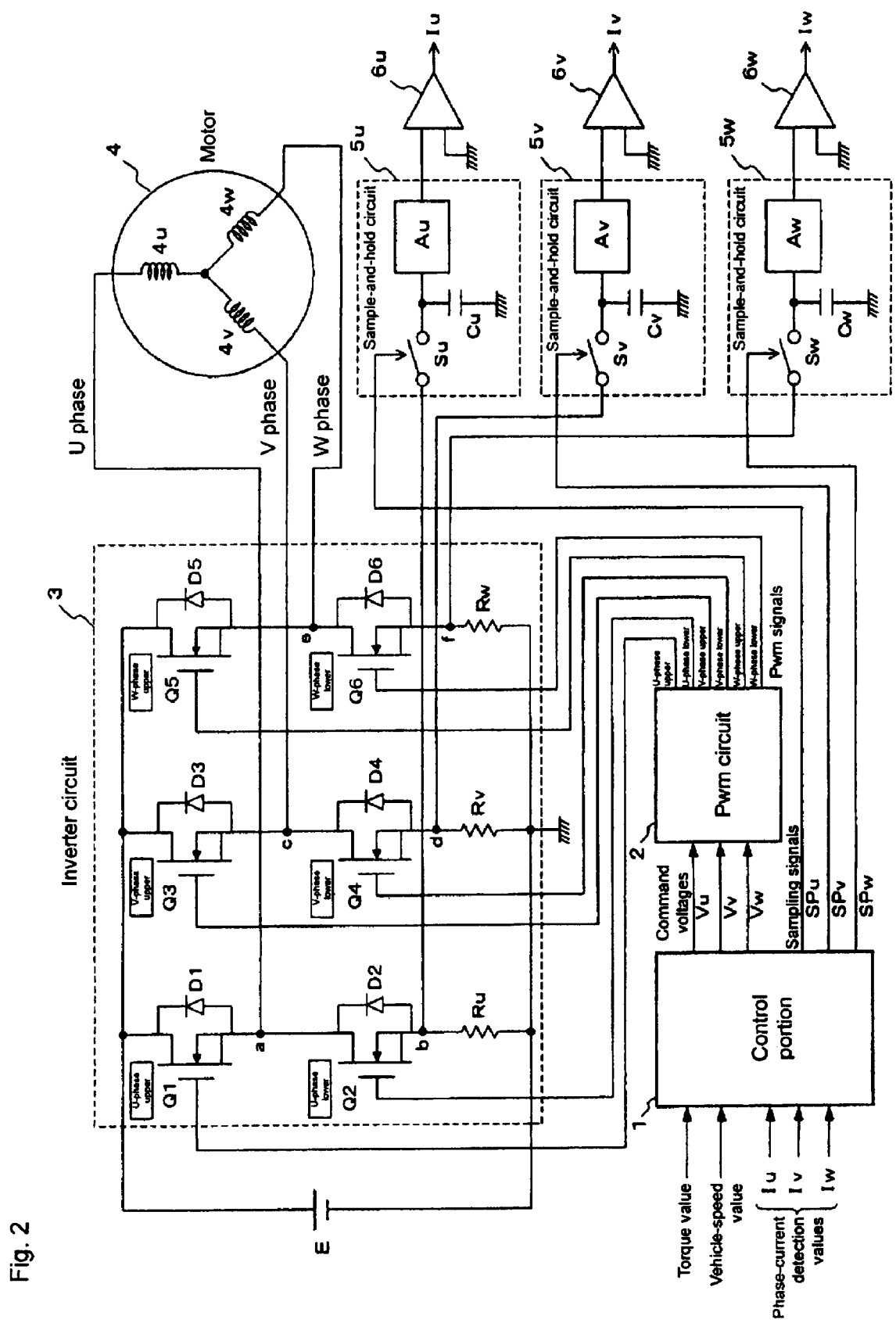
FIG. 2 shows a structural view of a motor driving circuit.

FIG. 2 is a structural view of a motor driving circuit.

Reference numeral 1 is a control portion comprising a CPU, a memory and the like. Reference numeral 2 is a well-known PWM circuit (switching control circuit) which outputs PWM signals having predetermined duty ratios on the basis of voltage command signals form the control portion 1 for controlling the switching of switching devices Q1 to Q6. Reference numeral 3 is an inverter circuit which outputs motor-driving three-phase voltages (an U-phase voltage, a V-phase voltage and a W-phase voltage) on the basis of the PWM signals from the PWM circuit 2. Reference numeral 4 is a motor (three-phase brushless motor) which is connected to the output side of the inverter circuit 3 and is driven by three-phase voltages output from the same inverter circuit 3. 4u, 4v and 4w are the windings of the motor 4. Reference numerals 5u, 5v and 5w are sample-and-hold circuits which sample voltages for phase current direction for a predetermined time interval and hold the sampled voltages. Reference numerals 6u, 6v and 6w are DC-current amplification circuits which amplify the outputs of the sample-and-hold circuits 5u, 5v and 5w. The control portion 1, the PWM circuit 2, the inverter circuit 3 and the sample-and-hold circuits 5u, 5v and 5w constitute the motor driving circuit P.

The inverter circuit 3 is connected between a positive electrode and a negative electrode (ground) of a battery E and converts the DC voltage of the battery E into an AC voltage. The inverter circuit 3 is a well-known circuit and includes pairs of upper and lower arms provided in association with the U phase, the V phase and the W phase, the respective arms including switching devices Q1 to Q6 and free wheeling diodes D1 to D6 connected in parallel with these respective switching devices. The switching devices Q1 to Q6 are constituted by MOS FETs (field effect transistors), but, instead thereof, IGBTs (insulated gate bipolar transistors) or other devices can be employed. The respective gates of the switching devices Q1 to Q6 are individually supplied with 6 types of PWM signals (the U-phase upper arm, the U-phase lower arm, the V-phase upper arm, the V-phase lower arm, the W-phase upper arm and the W-phase lower arm) from the PWM circuit 2. During the ON (High) intervals of the PWM signals, the switching devices Q1 to Q6 are on (at a conduction state), while during the OFF (Low) intervals of the PWM signals the switching devices Q1 to Q6 are off (at a cut-off state).

Through the ON/OFF operations of the switching devices Q1 to Q6, a U-phase voltage, a V-phase voltage and a W-phase voltage for driving the motor are extracted from connection points a, c and e between the upper and lower arms of the respective phases in the inverter circuit 3 and are supplied to the motor 4. Namely, a U-phase voltage is extracted from the connection point a between the switching devices Q1 and Q2 and is supplied to the U-phase winding 4u of the motor 4. A V-phase voltage is extracted from the connection point c between the switching devices Q3 and Q4 and is supplied to the V-phase winding 4v of the motor 4. A W-phase voltage is extracted from the connection point e between the switching devices Q5 and Q6 and is supplied to the W-phase winding 4w of the motor 4.

There are provided electric-current detection resistances Ru, Rv and Rw for detecting the phase currents in the motor 4 during normal operation (at a normal state), on the lower arms of the respective phases in the inverter circuit 3. The electric-current detection resistance Ru is connected in serial to the switching devices Q1 and Q2, and the voltage generated between the opposite ends of the resistance Ru (the electric potential at a point b) is input to the sample-and-hold circuit 5u. The electric-current detection resistance Rv is connected in serial to the switching devices Q3 and Q4, and the voltage generated between the opposite ends of the resistance Rv (the electric potential at a point d) is input to the sample-and-hold circuit 5v. The electric-current detection resistance Rw is connected in serial to the switching devices Q5 and Q6, and the voltage generated between the opposite ends of the resistance Rw (the electric potential at a point f) is input to the sample-and-hold circuit 5w.

The sample-and-hold circuits 5u, 5v and 5w include switches Su, Sv, and Sw, condensers Cu, Cv, and Cw and differential amplifiers Au, Av, and Aw, respectively. When electric currents flow through the electric-current detection resistances Ru, Rv and Rw in the inverter circuit 3 and, thus, voltages to be detected are generated between the opposite ends of the resistances, the switches Su, Sv and Sw are set to ON through sampling signals SPu, SPv and SPw from the control portion 1, and the voltages to be detected are sampled in such a way that they charge the condensers Cu, Cv and Cw through the switches Su, Sv and Sw being on. Thereafter, when electric currents no longer flow through the electric-current detection resistances Ru, Rv and Rw and there is a necessity to hold the sampled voltages, the switches Su, Sv and Sw are turned off to maintain the voltages charged at the condensers Cu, Cv and Cw. The voltages which have been sampled and held as described above are amplified by the DC amplification circuits 6u, 6v and 6w, and the amplified voltages are output as electric-current detection signals Iu, Iv and Iw. These electric-current detection signals Iu, Iv and Iw, which indicate the values of actual electric currents flowing through the respective phases of the motor 4, are supplied, as phase-current detection values, to the control portion 1.

The control portion 1 calculates the electric currents to be flowed through the respective phases of the motor 4, namely the target values of the motor electric currents for providing a required steering aiding force, on the basis of the torque value detected by the torque sensor (not illustrated) and the vehicle-speed value detected by the vehicle-speed sensor (not illustrated), and makes comparisons between these target values and the electric-current detection values Iu, Iv and Iw to determine the deflections therebetween. Then, on the basis of the resultant deflections, the control portion 1 calculates command voltages Vu, Vv and Vw for the respective phases which are to be supplied to the PWM circuit 2. The command voltages are parameters for performing feedback control such that electric currents having the target values flow through the windings 4u, 4v and 4w of the respective phases in the motor 4. The PWM circuit 2 creates 6 types of PWM signals having predetermined duty ratios as described above, on the basis of the command voltages, such that a U-phase voltage, a V-phase voltage and a W-phase voltage corresponding to the command voltages Vu, Vv and Vw are supplied to the motor 4.

Then, the PWM circuits 2 supply them to the switching devices Q1 to Q6 in the inverter circuit 3.

In the inverter circuit 3, generally, at an ON state (during a first powering time interval), an electric current flows through a path along the battery E, the switching device on an upper arms, the motor 4 and the switching device on a lower arm and, at a subsequent OFF state (during a first regenerative time interval), the lower switching devices, the electric-current detection resistances and the motor constitute a closed circuit, through which a regenerated electric current (an induced electric current) flow. The PWM circuit 2 outputs PWM signals as pulse signals for creating such a first powering time interval and such a first regenerative time interval.

Figure 3:
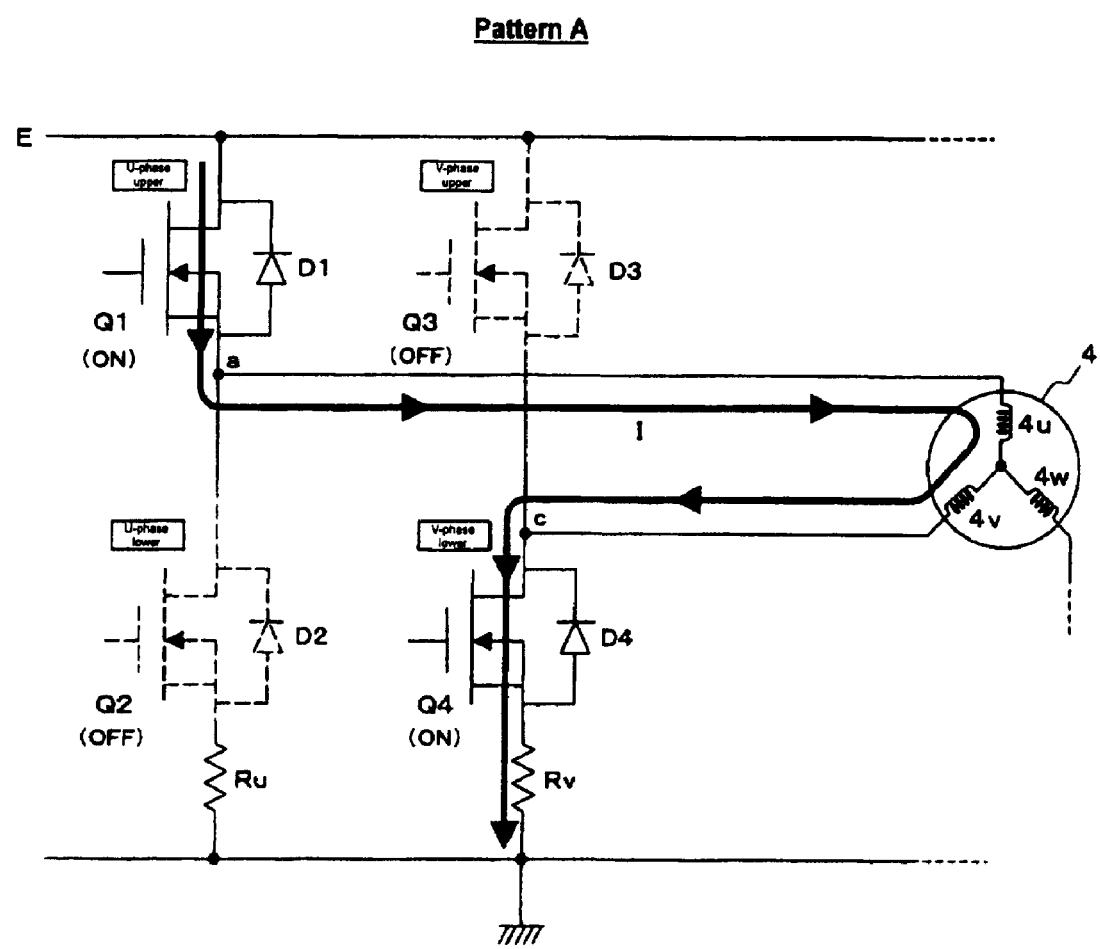
FIG. 3 shows a view illustrating the electric-current path in a pattern A.

FIG. 3 shows a first powering time interval during which the switching device Q1 in upper arm and the switching device Q4 in a lower arm are on, thereby causing an electric current to flow from the battery E to the motor 4. The behavior during the first powering interval will be referred to as a pattern A.

In FIG. 3, the ON/OFF states of the switching devices Q1 to Q6 are illustrated by solid lines and broken lines. The switching devices Q1 and Q4 illustrated by the solid lines are at an ON state, while the switching devices Q2 and Q3 illustrated by the broken lines are at an OFF state. The same applies to FIG. 4 and FIG. 5 which will be described later. The pattern A is a pattern in which the switching device (Q1) in the upper arm is on and the switching device (Q2) in the lower arm is off in a single phase (the U phase), while the switching device (Q3) in the upper arm is off and the switching device (Q4) in the lower arm is on in another phase (the V phase). Although the W phase is not illustrated in FIG. 3 for ease of description, the same relationship as that between the U phase and the V phase is established between the U phase and the W phase and between the V phase and the W phase. The same applies to the other patterns which will be described later. Since the U-phase upper switching device Q1 is on and the V-phase lower switching device Q4 is on in FIG. 3, a phase electric current I flows through a path along the battery E, the switching device Q1, the U-phase winding 4u of the motor 4, the V-phase winding 4v, the switching device Q4 and the phase-current detection resistance Rv, as designated by a thick arrow, on the basis of the DC voltage of the power supply E.

Figure 4:
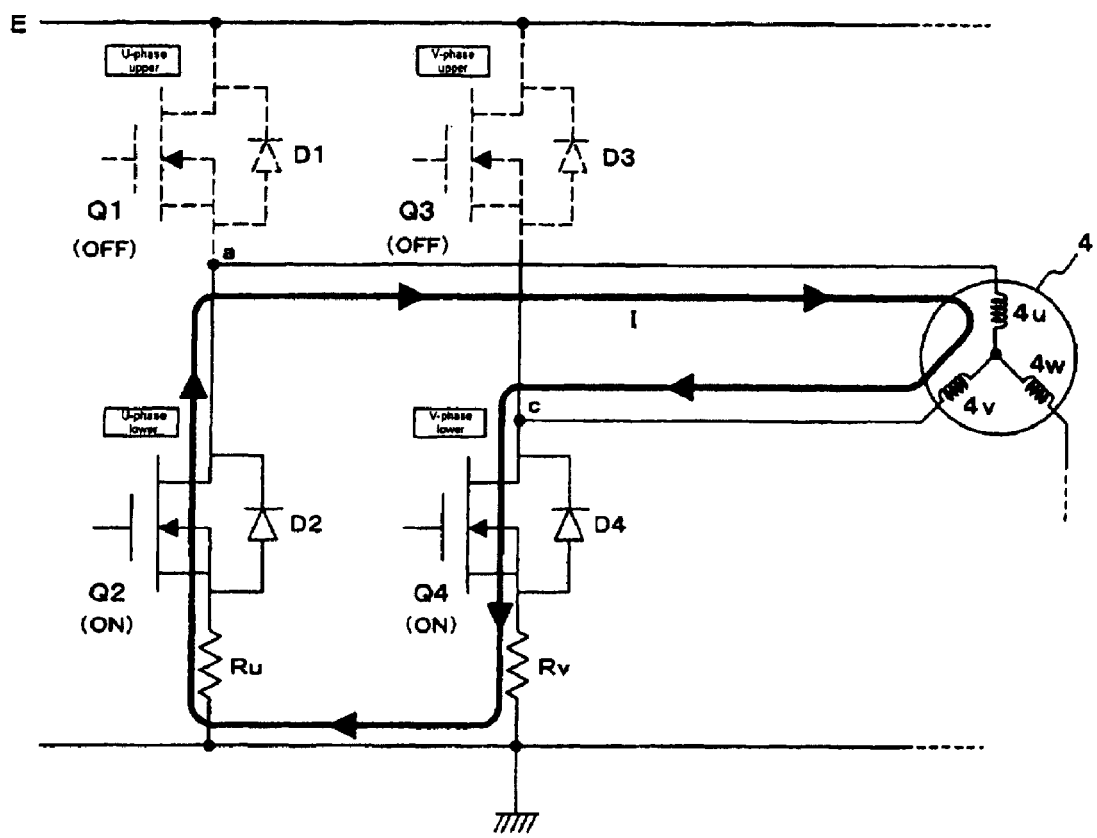
FIG. 4 shows a view illustrating the electric-current path in a pattern B.

FIG. 4 illustrates a state where the inverter circuit 3 has shifted to a first regenerative time interval from the state of FIG. 3, wherein the switching device Q1 in an upper arm is off while the switching device Q2 in a lower arm is on. The behavior during the second time interval will be referred to as a pattern B.

The pattern B is a pattern in which the switching device (Q1) in the upper arm is off, but the switching device (Q2) in the lower arm is on in a single phase (the U phase) while the switching device (Q3) in the upper arm is off, but the switching device (Q4) in the lower arm is on in another phase (the V phase). Since the U-phase lower switching device Q2 is on and the V-phase lower switching device Q4 is on in FIG. 4, a phase electric current I flows through a path along the U-phase winding 4u, the V-phase winding 4v, the switching device Q4, the electric-current detection resistance Rv, the electric-current detection resistance Ru, the switching device Q2 and the U-phase winding 4u, as designated by a thick arrow, on the basis of the electric energy accumulated in the windings 4u and 4v of the motor 4. This phase electric current I is a regenerated electric circuit (induced electric current) based on the electric energy accumulated in the windings 4u and 4v.

After the pattern B of FIG. 4, a powering time interval for the motor 4 is started again. In the second powering time interval, upper and lower switching devices different from the upper and lower switching devices which are on in FIG. 3 are on to supply an electric current to the motor 4.

Figure 5:
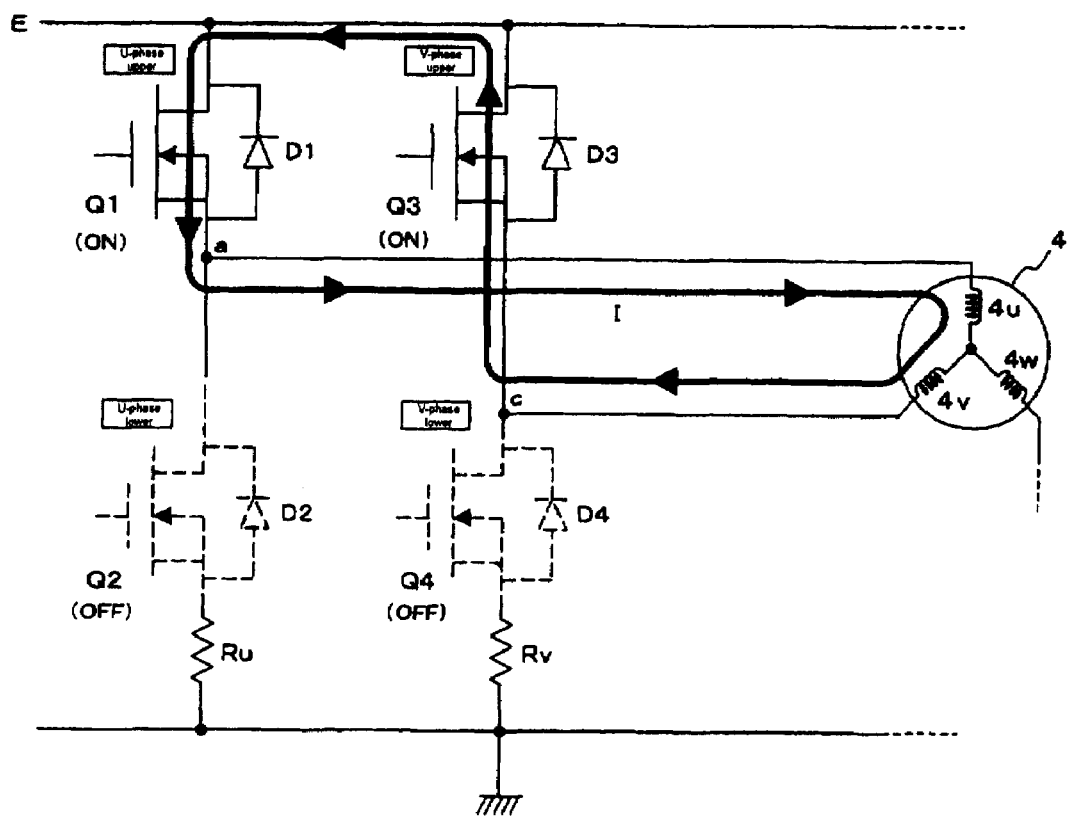
FIG. 5 shows a view illustrating the electric-current path in a pattern C.

After the second powering time interval, the inverter circuit 3 shifts to a second regenerative time interval. FIG. 5 illustrates a state where the inverter circuit 3 has shifted to the second regenerative time interval and the switching devices Q1 and Q3 in the upper arms are on.

The pattern C is a pattern in which the switching device (Q1) in the upper arm is on and the switching device (Q2) in the lower arm is off in a single phase (the U phase), while the switching device (Q3) in the upper arm is also on and the switching device (Q4) in the lower arm is off in another phase (the V phase). Since the U-phase upper switching device Q1 is on and the V-phase upper switching device Q3 is on in FIG. 5, a phase electric current I flows through a path along the U-phase winding 4u, the V-phase winding 4v, the switching device Q3, the switching device Q1 and the U-phase winding 4u, as designated by a thick arrow, on the basis of the electric energy accumulated in the windings 4u and 4v of the motor 4. This phase electric current I is a regenerated electric circuit (induced electric current) based on the electric energy accumulated in the windings 4u and 4v.

The inverter circuit 3 is shifted from some states to other states, in such a way that it is shifted from the first powering time interval (the pattern A) to the first regenerative time interval (the pattern B), then from the first regenerative time interval (the pattern B) to the second powering time interval (the pattern A) and, then, from the second powering time interval (the pattern A) to the second regenerative time interval (the pattern C), to control the electric currents in the motor 4.

The phase electric currents flowed through the electric-current detection resistances Ru and Rv resulted from the duty-ratio control in the patterns A to C are detected, and these duty ratios are controlled such that the detected values of the phase electric currents reach target values to control the rotational angle of the motor 4.

Further, in the event of an excessive electric current flowing through the inverter circuit due to failures and the like of the inverter circuit 3, the values of electric currents flowing through the electric-current detection resistances Ru and Rv are detected for detecting the excessive electric-current state. At this time, a protective circuit which is not illustrated is activated to protect the inverter circuit.

Figure 6:
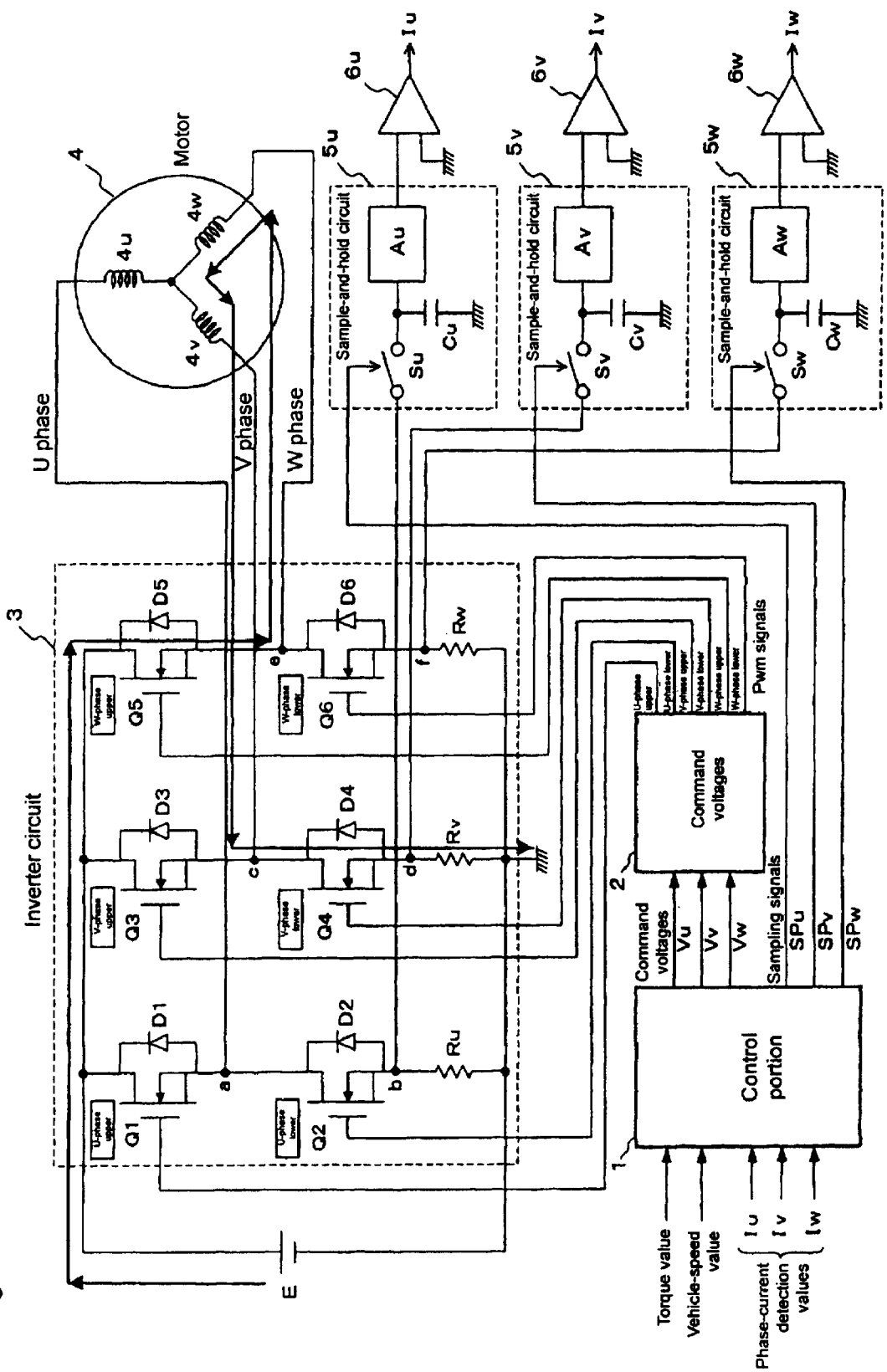
FIG. 6 shows a view illustrating the electric-current path to windings 4v and 4w in the pattern A.
Figure 7:
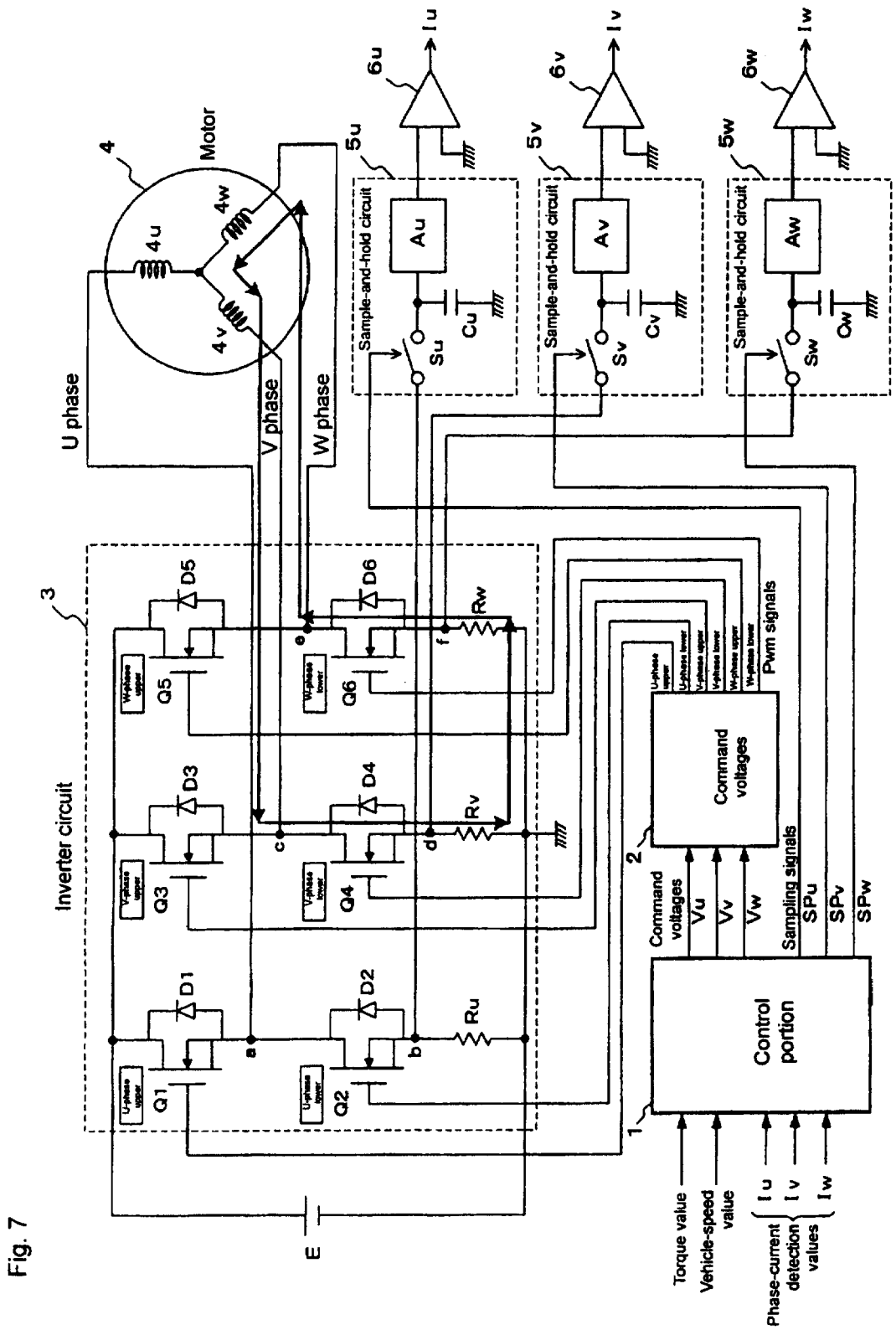
FIG. 7 shows a view illustrating the electric-current path to windings 4v and 4w in the pattern B.

In the switching control of the inverter circuit 3, the patterns A to C are alternately performed for the respective windings of the motor and, therefore, switching control as in FIGS. 6 and 7 is performed for the windings 4v and 4w, for example. Among them, FIG. 6 illustrates the pattern A, and FIG. 7 illustrates the pattern B. By repeating them, the control of the motor and the detection of excessive electric currents are performed.

Next, there will be described operations which are performed in the event of a ground fault.

Figure 8:
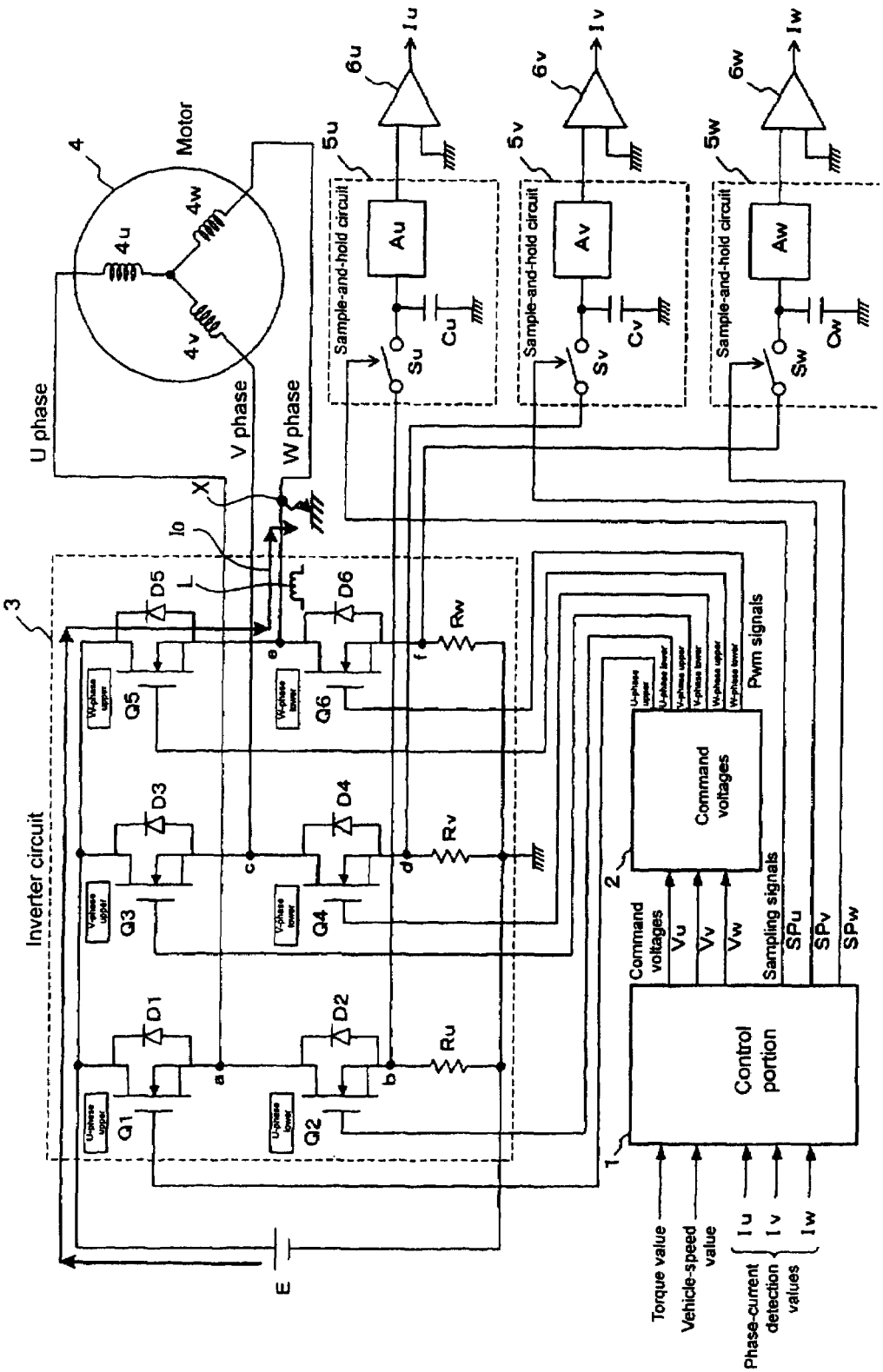
FIG. 8 shows a view illustrating the electric-current path to windings 4v and 4w in the pattern A, in the event of the occurrence of a ground fault.
Figure 9:
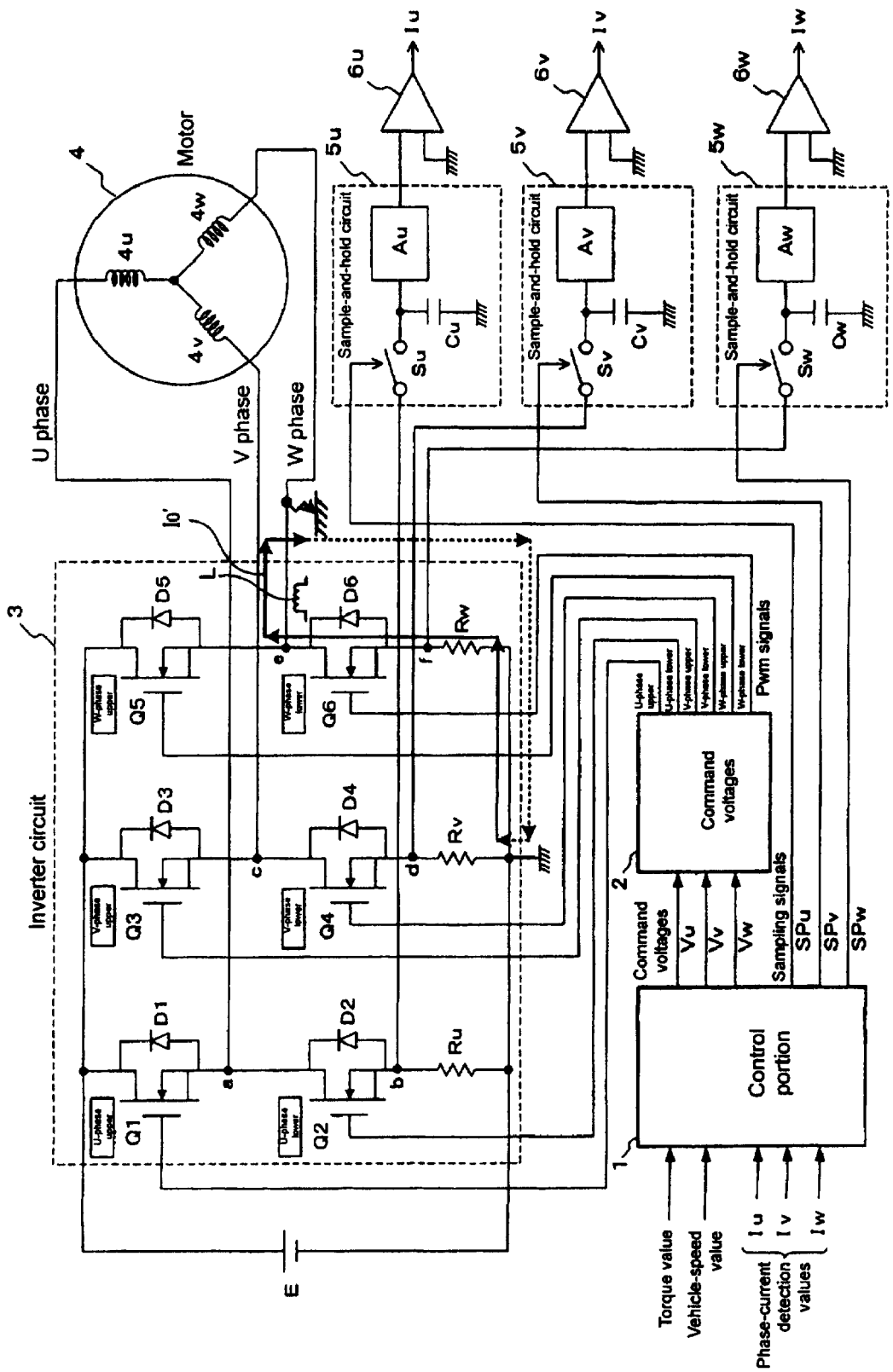
FIG. 9 shows a view illustrating the electric-current path to windings 4v and 4w in the pattern B, in the event of the occurrence of a ground fault.

Hereinafter, consideration will be made for a case where, during control of the windings 4v and 4w, a ground fault occurs in the electric-current path. In this case, the ground fault is a ground fault accident occurred at a point X in the line which connects the point e, which is an output point of the inverter circuit 3, to the winding 4v of the motor 4. In such a ground fault occurs, the ground fault occurs at the point X as in FIG. 8 during the pattern-A operation, which induces a ground-fault current Io flowing through the battery E and the switching device Q5 to the ground. However, due to the existence of an inductance component (parasitic inductance) L between the point e and the point x, ground-fault electric current energy is accumulated in the inductance component L. Then, when the inverter circuit is shifted to the pattern B at the subsequent moment, as shown in FIG. 9, the ground-fault electric current energy is discharged through the switching device Q6, the electric-current detection resistance Rw and the closed circuit between the grounds, thereby causing an electric current Io' flowing therealong. At this time, the electric current Io' largely exceeds such an electric current value that can be detected as an excessive electric current as described above, since the significantly larger ground-fault electric current Io was occurred immediately before the pattern B. Therefore, in the event that the electric current flowing through the electric-current detection resistance Rw significantly exceeds an electric current value detected as an excessive electric current, the motor driving device according to the present embodiment detects an occurrence of a ground fault in the line connecting the point e, which is an output point of the inverter circuit 3, to the winding 4w of the motor 4.

In the event of a ground fault in the connection lines for the other phases (the U phase and the V phase), the same operations can be performed for detecting the ground fault.

As described above, in the event of a ground fault, large energy is accumulated in the parasitic inductance during the pattern A and, therefore, the ground fault can be detected utilizing the accumulated larger energy, during the subsequent pattern B. This enables detection of such a ground fault using the electric-current detection resistances Ru, Rv and Rw which are used in detection of electric currents during normal operations or detection of excessive electric currents in the inverter circuit.

The invention claimed is:

1. A ground-fault detection device for a motor driving circuit comprising:
   an inverter circuit comprising upper switching devices and lower switching devices which are connected in a bridge and are connected at output sides to respective phases of a motor;
   electric-current detection resistances connected between respective lower switching devices in the inverter circuit and ground;
   a switching control circuit which repeatedly causes
      a first powering time interval during which an electric current flows from a power supply through an upper switching device in the inverter circuit, the motor, and a lower switching device for powering the motor,
      a first regenerative time interval during which lower switching devices, electric-current detection resistances and the motor constitute a closed circuit and a regenerated electric current flows through the circuit,
      a second powering time interval during which an electric current flows from the power supply through an upper switching device in the inverter circuit, the motor, and a lower switching device for powering the motor and
      a second regenerative time interval during which upper switching devices and the motor constitute a closed circuit and a regenerated electric current flows through the circuit and, performs switching control for switching among respective time intervals; and
   electric-current detection circuits for detecting values of the electric currents flowing through the electric-current detection resistances during the switching control,
   wherein, in an event that an electric current value detected by the electric-current detection circuits during the first regenerative time interval becomes equal to or greater than a predetermined electric current value by a ground-fault electric current based on a ground-fault electric energy that is accumulated in an inductance component between the inverter circuit and the motor, a ground-fault is determined to have occurred in connection lines between the inverter circuit and the motor.

2. The ground-fault detection device for a motor driving circuit according to claim 1, wherein the switching control circuit performs the switching control based on the electric current values detected by the electric-current detection circuits during the first powering time interval, the first regenerative time interval, or the second powering time interval, at a normal operation state.

* * * * *